United States Patent [19]
Exposito et al.

[11] Patent Number: 6,087,202
[45] Date of Patent: Jul. 11, 2000

[54] PROCESS FOR MANUFACTURING SEMICONDUCTOR PACKAGES COMPRISING AN INTEGRATED CIRCUIT

[75] Inventors: Juan Exposito, St. Nazaire les Eymes; Laurent Herard, Bizonnes, both of France; Andrea Cigada, Milan, Italy

[73] Assignee: STMicroelectronics S.A., Gentilly, France

[21] Appl. No.: 09/090,009

[22] Filed: Jun. 3, 1998

[30] Foreign Application Priority Data

Jun. 3, 1997 [FR] France ................................. 97 06808

[51] Int. Cl.⁷ .................................................. H01L 21/44
[52] U.S. Cl. .................. 438/113; 438/110; 438/114; 438/124; 438/127; 438/460; 438/464
[58] Field of Search .................................. 257/723, 738, 257/787; 29/840; 438/113, 124, 126, 127, FOR 365, FOR 371, 110, 114, 460, 464

[56] References Cited

U.S. PATENT DOCUMENTS

| | | | |
|---|---|---|---|
| 5,273,938 | 12/1993 | Lin et al. | 438/118 |
| 5,652,185 | 7/1997 | Lee | 438/124 |
| 5,731,231 | 3/1998 | Miyajima | 438/124 |
| 5,830,800 | 11/1998 | Lin | 438/459 |
| 5,832,600 | 11/1998 | Hashimoto | 29/841 |
| 5,937,512 | 8/1999 | Lake et al. | 29/832 |
| 5,950,070 | 9/1999 | Razon et al. | 438/113 |
| 5,989,982 | 11/1999 | Yoshikazu | 438/462 |

FOREIGN PATENT DOCUMENTS

| | | |
|---|---|---|
| 0751561A1 | 1/1997 | European Pat. Off. . |
| 3619636A1 | 12/1987 | Germany . |
| 59-215753 | 12/1984 | Japan . |
| 7-183318 | 7/1995 | Japan . |
| 8-031854 | 2/1996 | Japan . |
| 8-139218 | 5/1996 | Japan . |
| 8-300394 | 11/1996 | Japan . |
| 09036151 | 2/1997 | Japan . |
| 09083741 | 3/1997 | Japan . |

*Primary Examiner*—Donald L. Monin, Jr.
*Assistant Examiner*—Alonzo Chambliss
*Attorney, Agent, or Firm*—Theodore E. Galanthay; Fleit, Kain, Gibbons, Gutman & Bongini PL

[57] ABSTRACT

A process for manufacturing semiconductor packages comprising, respectively, a substrate, a chip which forms an integrated circuit and is attached to one region of the substrate, electrical connection means connecting the chip to a group of external electrical connection regions lying on one face of the substrate, as well as an encapsulation encasement. The process consists in producing, in a matrix configuration, a multiplicity of groups of connection regions (104*a*) on a common substrate plate (102), corresponding to as many chip attachment regions (109), in attaching a chip (103) to each attachment region (109) of the common substrate plate, in electrically connecting each chip (103) to the associated electrical connection regions (104*a*), so as to obtain an assembly (111) consisting of the substrate plate and the connected chips. The process consists, in a second step, in placing this assembly (111) in a mold (112) and in injecting an encasement material (106) into the mold so as to obtain, in a single molding operation, a parallelepipedal block (117) and then, in a subsequent step, in cutting the said parallelepipedal block (117) through its thickness into units, each constituting a semiconductor package.

2 Claims, 5 Drawing Sheets

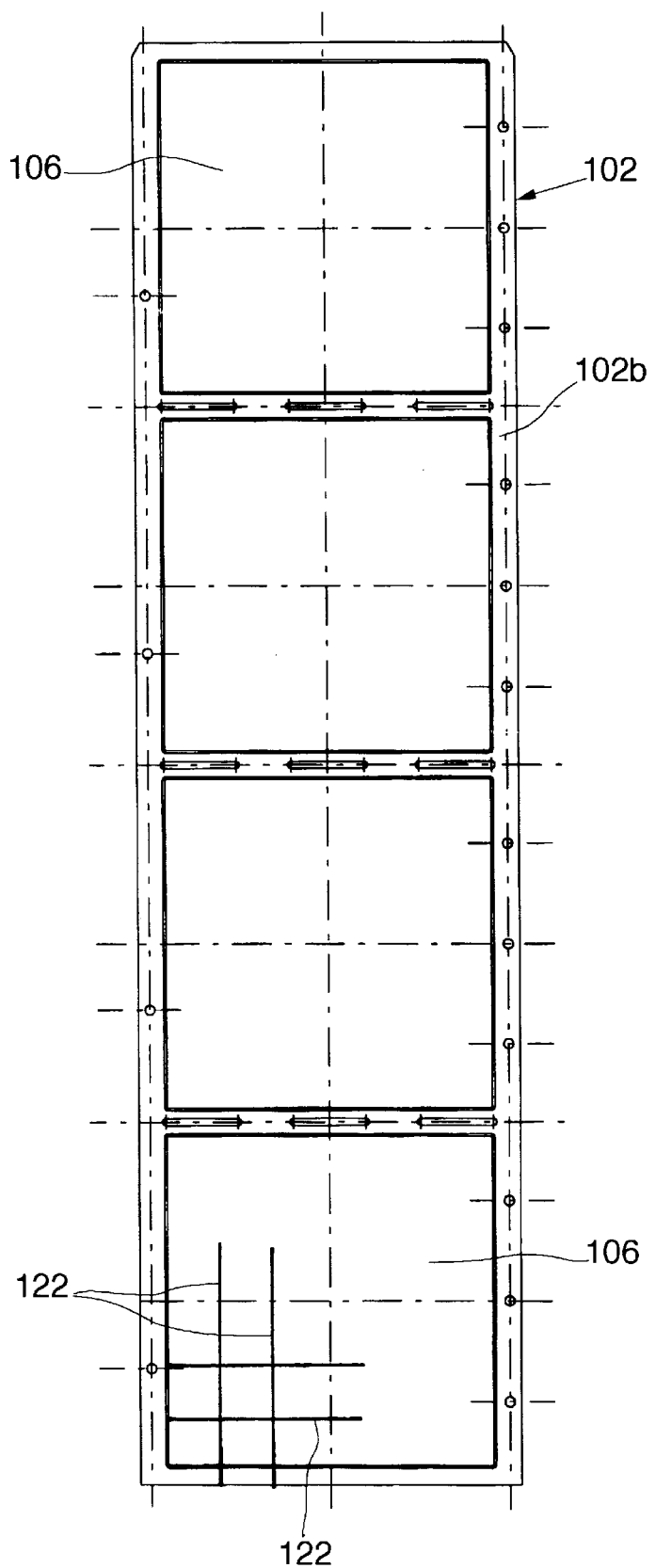

PROCESS FOR MANUFACTURING SEMICONDUCTOR PACKAGES COMPRISING AN INTEGRATED CIRCUIT

CROSS-REFERENCE TO RELATED APPLICATIONS

This application is based upon and claims the benefit of the priority of the prior French patent application 97 06808 filed on Jun. 3, 1997, the contents of which are incorporated herein.

BACKGROUND OF THE INVENTION

1. Field of the Invention

The present invention relates to a process for manufacturing semiconductor packages comprising, respectively, a substrate, a chip which forms an integrated circuit and is attached to one region of the substrate, electrical connection means connecting the chip to external electrical connection regions lying on one face of the substrate, as well as an encapsulating encasement of resin.

2. Description of the Related Art

In principle, the external electrical connection regions of a semiconductor chip and the chip are placed on each side of a substrate and, on one side of the substrate, the encasement surrounds the chip and the electrical connection means.

In the manufacturing technique currently used, each of the chips attached and connected to a substrate plate is individually encased by placing this plate in a mold which has as many individual cavities as there are chips. The substrate is then cut between each encasement. This solution requires the manufacture, use and storage of as many different molds for injecting the encasement as there are different packages having different sizes of chips and different placements of these chips on a substrate plate. Likewise, it is necessary to have a particular cutting tool assigned to each size of chip and to each size of substrate plate. There is a need for an improved process for making semiconductor packages.

SUMMARY OF THE INVENTION

An object of the present invention is to provide a process for manufacturing semiconductor packages which is capable of allowing manufacturing savings and of obtaining greater production flexibility.

A process according to the invention is intended for the manufacture of semiconductor packages comprising, respectively, a substrate, a chip which forms an integrated circuit and is attached to one region of the substrate, electrical connection means connecting the chip to a group of external electrical connection regions lying on one face of the substrate, as well as an encapsulating encasement.

According to the invention, the process comprises producing, in a matrix configuration, a multiplicity of groups of connection regions on a common substrate plate, corresponding to as many chip attachment regions, in attaching a chip to each attachment region of the common substrate plate and in electrically connecting each chip to the associated electrical connection regions, so as to obtain an assembly consisting of the substrate plate and the connected chips. According to the invention, the process consists, in a second step, in placing this assembly in a mold and in injecting an encasement material into the mold so as to obtain, in a single molding operation, a parallelepipedal block, and, in a subsequent step, in cutting the said parallelepipedal block through its thickness into units, each constituting a semiconductor package.

BRIEF DESCRIPTION OF THE DRAWINGS

The present invention will be more clearly understood on studying a process for manufacturing semiconductor packages which is described by way of non-limiting example and illustrated by the drawing in which:

FIG. 7 represents a rear view of the block leaving the said mold.

DETAILED DESCRIPTION OF AN EMBODIMENT

Figure 1:
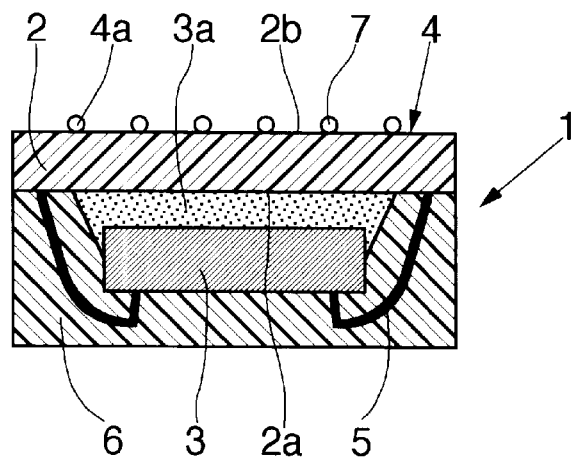
FIG. 1 represents diagrammatically a cross-section of a semiconductor package obtained by a process according to the invention.
Figure 2:
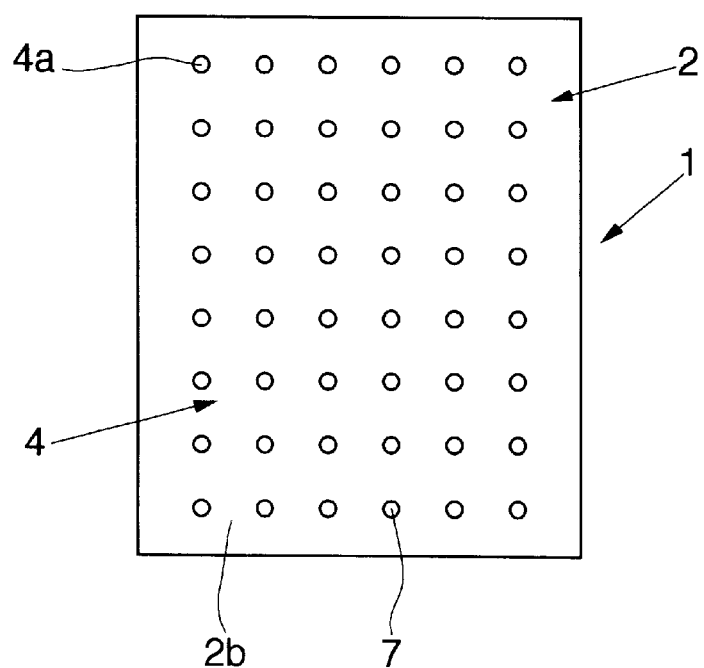
FIG. 2 represents a front view of the package.
Figure 3:
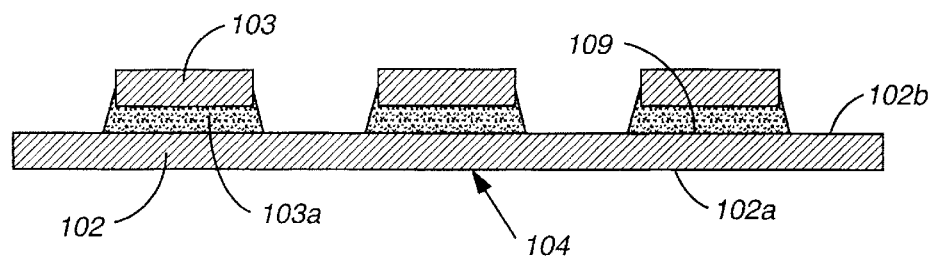
FIG. 3 shows diagrammatically a first step in the process according to the invention and represents, in cross-section, a substrate plate provided with chips.

Referring to FIGS. 1 and 2, it may be seen that a parallelepipedal semiconductor package, identified in a general manner by the reference numeral 1, obtained by the manufacturing process which will now be described, comprises a flat substrate 2, for example having a square outline, a chip 3 fastened to a face 2a of the substrate 2 by means of a thin layer of adhesive 3a, a multiplicity of external electrical connection regions 4 distributed over that face 2b of the substrate 2 which is opposite its face 2a, electrical connection means selectively connecting the chip 3 and the electrical connection regions 4 and comprising electrical connection wires 5 terminating on the substrate 2 and internal connections to this substrate, these not being shown, as well as an encasement 6 of resin for encapsulating the chip 3 and the connection wires 5, this encasement 6 lying on the same side of the substrate 2 as the face 2a. Furthermore, the semiconductor package 1 is provided with connection drop beads 7 on each of the electrical connection regions 4, for the purpose of soldering and electrically connecting the semiconductor package 1, for example to the tracks on a printed-circuit board.

Figure 4:
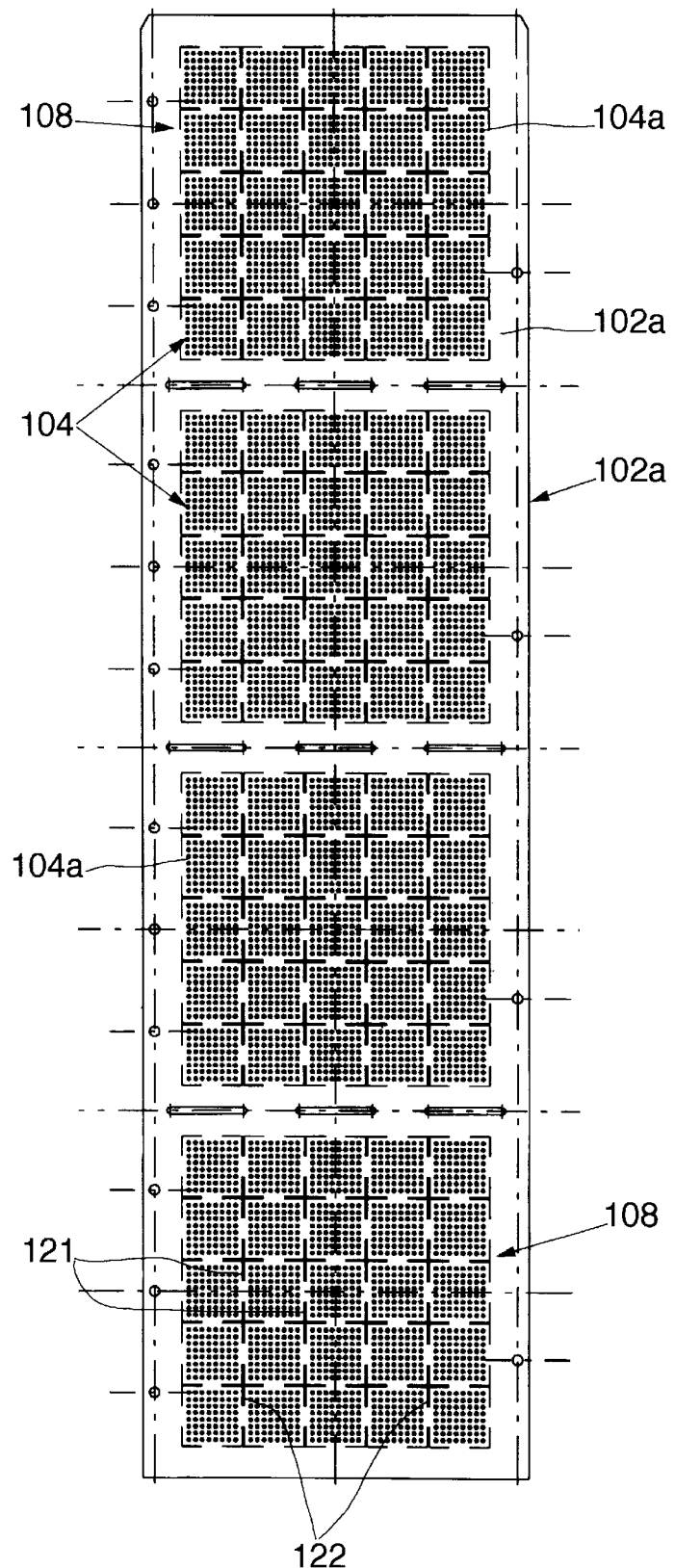
FIG. 4 represents a front view of that face of the said substrate plate which is attached to the chips.

Referring to FIG. 4, it may be seen that the manufacturing process described consists in producing, on a face 102a of a common rectangular substrate plate 102, a multiplicity of groups 104 of electrical connection regions 104a and of electrical connection means passing through the common substrate plate 102 and connected to the regions 104a.

In the example shown, the groups 104 are placed in a matrix configuration on the face 102a, there being five of them in the width direction of the common substrate plate 102 and twenty of them in its length direction, the space separating the groups of the fifth and sixth rows, the tenth and eleventh row and the fifteenth and sixteenth row in the length direction of the common substrate plate 102 being greater so as to form four sets 108 of twenty-five groups 104 spaced apart along the length of the common substrate plate 102.

Figure 5:
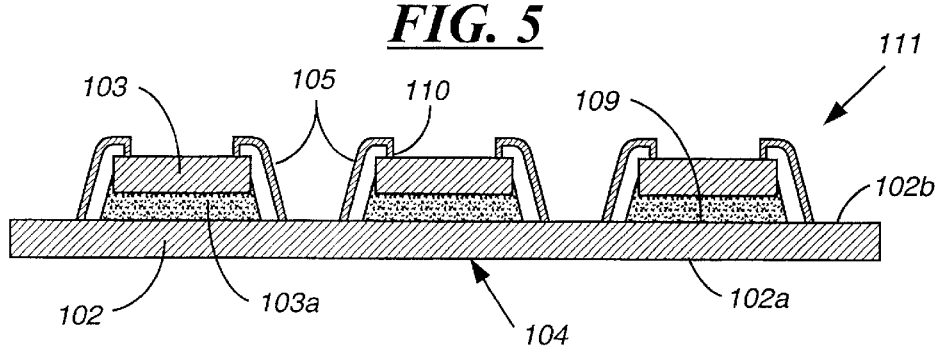
FIG. 5 shows diagrammatically a next step in the process according to the invention and represents the said substrate plate provided with chips electrically connected by wires.

Referring to FIG. 5, it may be seen that the next step in the manufacturing process described consists in attaching a multiplicity of chips 103 respectively to attachment regions 109 on that face 102b of the common substrate plate 102 which is opposite its face 102a, by means of thin layers of adhesive 103a. The chips 103 are then placed in a matrix configuration corresponding, across the common substrate plate 102, to the groups 104 of electrical connection regions 104a.

Referring to FIG. 5, it may be seen that the next step in the manufacturing process described consists in selectively connecting the connection pads 110 of the chips 103 to the connection means of the common substrate plate 102 by connecting them to the ends of electrical connection wires 105 which are then floating, so as to connect the pads on each chip 103 selectively to the electrical connection regions 104 of the groups 104 which are respectively connected to them. A connected assembly identified in a general way by the reference 111, comprising the common substrate plate 102 and the chips 103 connected as described above, is therefore obtained.

Figure 6:
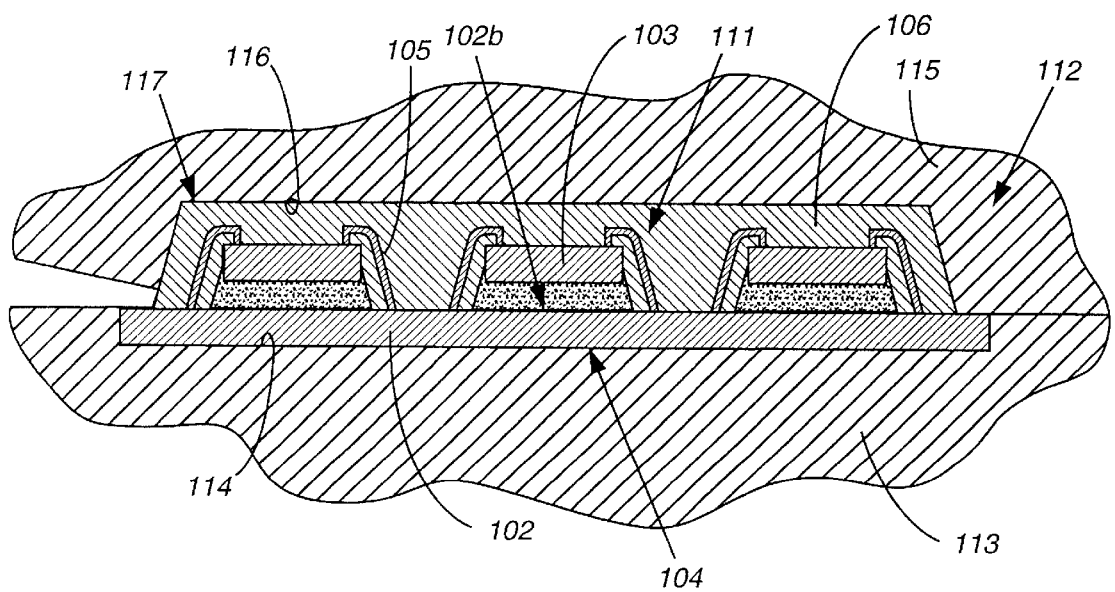
FIG. 6 shows diagrammatically a next step in the invention, consisting in encapsulating the said chips and the said wires in a mold represented in cross-section.

As shown in FIG. 6, the next step in the manufacturing process described consists in placing the assembly 111 inside an injection mold 112 comprising a part 113 which has a cavity 114 housing in its thickness the common substrate plate 102 and a part 115 which has four cavities 116 into which extend, respectively, at some distance from its walls, the chips 103 and the corresponding connection wires 105 of the sets 108.

This step next consists in injecting a resin for encapsulating the chips 103 and the connection wires 105 into the cavity 116 so as to obtain, in a single molding operation, four encasements 106 against the face 102a of the substrate plate 102. A substantially parallelepipedal block, identified in a general way by the reference 117, is thus obtained which has multichips 103 connected, in the encasements 106, to the common substrate plate 102.

Figure 8:
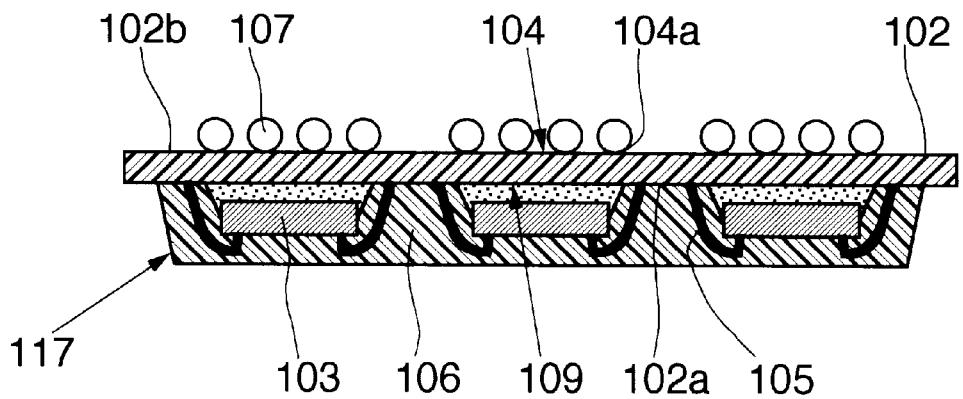
FIG. 8 shows diagrammatically a next step in the process according to the invention and represents a cross-section of the said block.

Referring to FIG. 8, it may be seen that in a subsequent step the manufacturing process described may consist in depositing a connection drop or bead 107 on each connection region 104 of the face 102a of the substrate plate 102.

Figure 9:
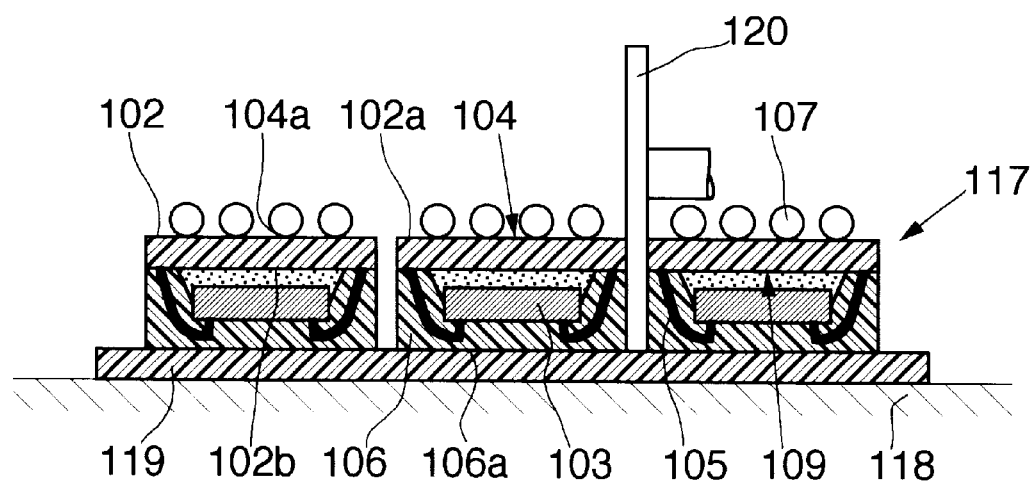
FIG. 9 shows diagrammatically a next step in the process according to the invention and represents a cross-section of the said block during an operation of sawing this block.

Referring to FIG. 9, it may be seen that the next step in the manufacturing process described consists in attaching the face 106a of the encasement 106 of the parallelepipedal block 117, opposite that face 102a of the common substrate plate 102 which is included in this block, to a plane support 118 by means of a peelable strip 119, both faces of which are self-adhesive.

The manufacturing process described then consists of cutting the parallelepipedal block 107 longitudinally and transversely, in the direction of its thickness, by means of a saw 120, along the longitudinal and transverse separating lines 121 and 122 extending between the said various groups 104 of electrical connection regions 104a to which the chips 103 are respectively connected. During this operation, the saw 120 is engaged across the parallelepipedal block 107 on the far side from its face 106a adhesively bonded to the strip 119 so as to carry out the cutting operation completely.

When the above cutting operation has been carried out, it is then possible to separate the various pieces of the parallelepipedal block 117 from the strip 119, each of these pieces corresponding to a semiconductor package 1, as described previously with reference to FIGS. 1 and 2.

The manufacturing process which has just been described has the advantage of being able to manufacture, in the same mold, designed to house a defined common substrate plate 102, semiconductor packages 1 of different sizes.

This is because it is possible to provide, on various common substrate plates 102, different numbers of groups 104 of electrical connection regions 104a covering different areas, correspondingly matching the dimensions of the associated chips 103, by placing them, as in the example described previously, in matrices matching the areas that the said groups of connection regions and the said chips occupy.

It will then be necessary to match only the distances between the various cutting lines 121 and 122 to the areas so as to obtain semiconductor packages whose outline has the desired dimensions.

What is claimed is:

1. A process for manufacturing semiconductor packages comprising: a substrate, a chip comprising an integrated circuit attached to at least one region of the substrate, electrical connection means connecting the chip to a group of external electrical connection regions lying on one face of the substrate, as well as an encapsulating encasement, the process comprising the steps of:

producing, in a matrix configuration, a plurality of groups of connection regions on a common substrate plate, each group corresponding to a chip attachment region;

attaching a chip to each attachment region of the common substrate plate;

electrically connecting each chip to the associated electrical connection regions, so as to obtain an assembly consisting of the substrate plate and the connected chips;

placing the assembly in an injection mold and injecting an encasement material into the mold so as to obtain, in a single molding operation, a parallelepipedal block, the mold having a cavity for receiving the common substrate plate and a cavity surrounding the connected chips on the substrate plate;

depositing balls or beads of a soldering material on the connection regions;

adhesively bonding that face of the parallelepipedal block which is free of connection regions to a peelable self-adhesive strip; and cutting the parallelepipedal block into units by engaging a saw across the block through its thickness, each unit constituting a semiconductor package, wherein the cutting step is performed while the parallelepipedal block is bonded to the strip.

2. The process of claim 1, further comprising carrying out the sawing operation by engaging the saw across the block on the far side from its face adhesively bonded to the strip.

* * * * *